(12) United States Patent
Loxley

(10) Patent No.: US 7,674,695 B1
(45) Date of Patent: Mar. 9, 2010

(54) WAFER CLEANING SYSTEM

(76) Inventor: Ted A. Loxley, 236 Tom Corwin Rd., Wellston, OH (US) 45692

( * ) Notice: Subject to any disclaimer, the term of this patent is extended or adjusted under 35 U.S.C. 154(b) by 1459 days.

(21) Appl. No.: 10/972,717

(22) Filed: Oct. 25, 2004

Related U.S. Application Data

(63) Continuation-in-part of application No. 09/490,162, filed on Jan. 22, 2000, now abandoned.

(51) Int. Cl.
*H01L 21/04* (2006.01)
(52) U.S. Cl. .................. 438/510; 438/689; 438/692; 438/693; 438/906; 257/E21.043; 134/1.3
(58) Field of Classification Search ............ 438/510, 438/906, 692, 693; 134/1, 227, 113, 166 C, 134/1.3; 257/E21.043
See application file for complete search history.

(56) References Cited

U.S. PATENT DOCUMENTS

| | | | | |
|---|---|---|---|---|
| 5,410,122 A | * | 4/1995 | Su et al. ............... | 219/121.44 |
| 5,531,862 A | * | 7/1996 | Otsubo et al. .......... | 438/798 |
| 5,821,175 A | * | 10/1998 | Engelsberg ............. | 438/795 |
| 6,010,964 A | * | 1/2000 | Glass .................. | 438/692 |
| 6,127,289 A | * | 10/2000 | Debusk ................. | 438/798 |
| 7,104,268 B2 | * | 9/2006 | Wu et al. .............. | 134/1.3 |

FOREIGN PATENT DOCUMENTS

JP 362026823 A * 2/1987

OTHER PUBLICATIONS

JP362026823A English language translation, Manufacture of Semiconductor Element, Feb. 4, 1987, pp. 1-11.*

* cited by examiner

*Primary Examiner*—Charles D Garber
*Assistant Examiner*—Angel Roman
(74) *Attorney, Agent, or Firm*—Vincent A. Greene

(57) ABSTRACT

An electromegasonic wafer cleaning system is disclosed that is extremely important, if not essential, in the fabrication of advanced microelectronic devices having a line width or feature size of from 0.05 to 0.10 micron. A unique synergistic combination is provided wherein piezoelectric transducer means are operated at a tolerable power level, such as from 1 to 2 watts per square centimeter, to minimize the risk of harm to the extremely delicate microcircuits and wherein the face of each wafer is negatively charged to a temperate voltage, such as from 5 to 20 volts, sufficient to cause effective removal of colloidal or sub 0.4-micron contaminant particles.

This unique wafer cleaning system supersedes and replaces the standard megasonic-assisted RCA-type wet wafer cleaning systems which have never been able to eliminate or provide efficient purging of harmful sub 0.1-micron particles.

11 Claims, 3 Drawing Sheets

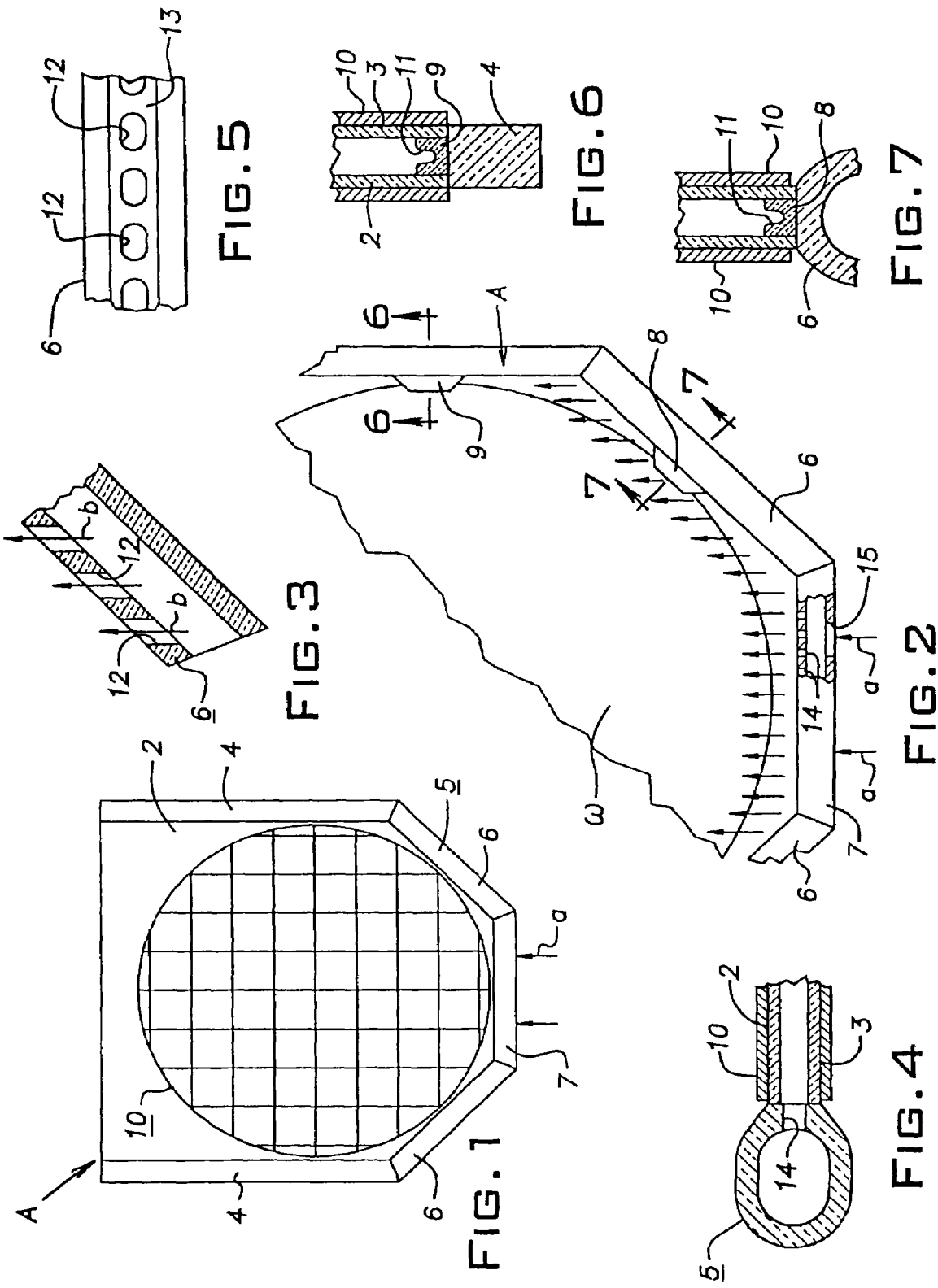

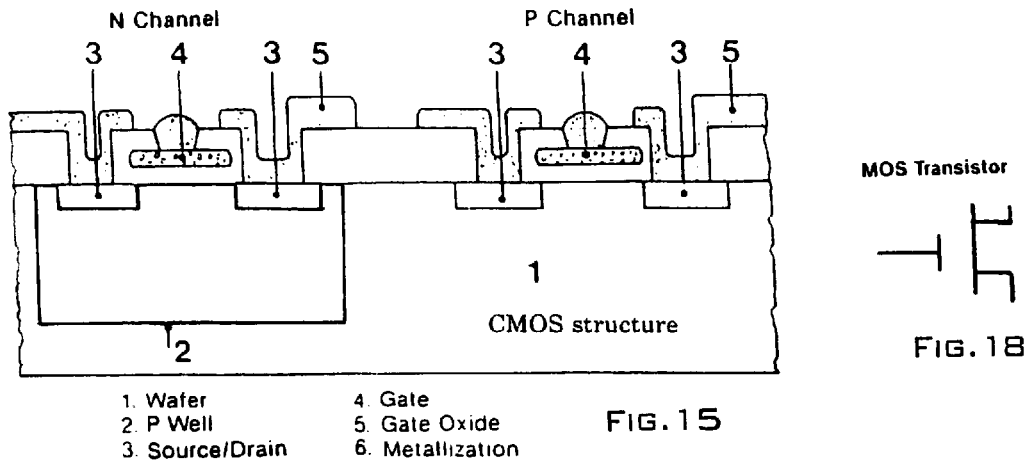
1. Wafer
2. P Well
3. Source/Drain
4. Gate
5. Gate Oxide
6. Metallization
FIG. 15
FIG. 18
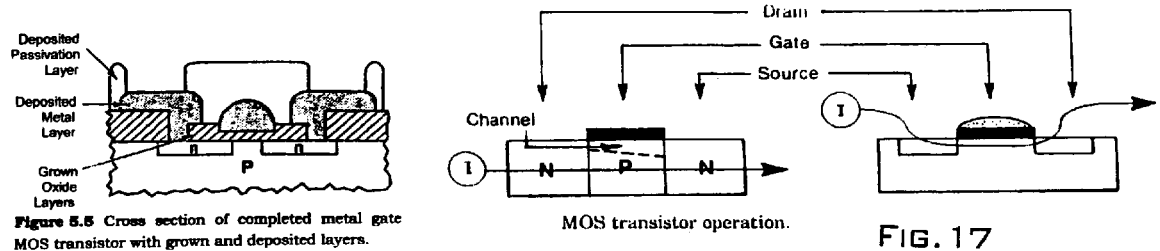
Figure 5.5 Cross section of completed metal gate MOS transistor with grown and deposited layers.
FIG. 16
MOS transistor operation.
FIG. 17
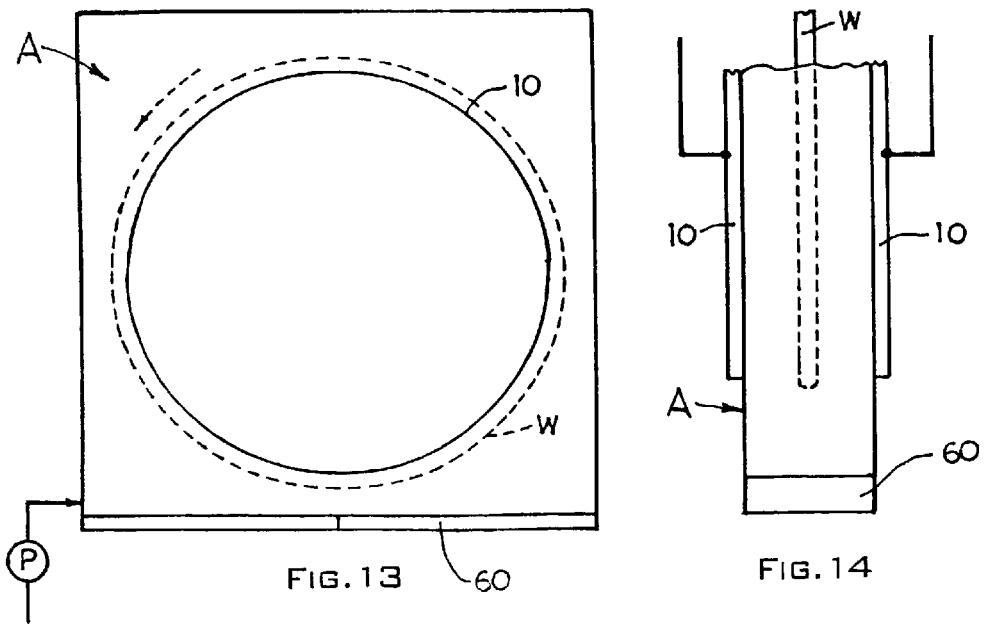
FIG. 13
FIG. 14

WAFER CLEANING SYSTEM

This application is a continuation-in-part of application Ser. No. 09/490,162 filed on Jan. 22, 2000, now abandoned and contains divisional subject matter.

The invention as shown and described herein relates to the cleaning of semiconductor wafers in the manufacture of microprocessors, integrated circuits, and other sophisticated electronic devices. The invention involves the discovery of a seemingly simple and very effective wet cleaning system that can substantially eliminate colloidal or sub 0.05-micron particles during the fabrication and processing of semiconductor wafers.

A preferred embodiment of the invention relates to a simple and unique cleaning apparatus comprising a special shaped receptacle designed for a single silicon wafer.

This invention provides a superb electromegasonic wafer cleaning system that may be indispensable or vitally important in the fabrication of the most advanced microelectronic devices. The remarkable synergistic combination of limited-power megasonic transducer means and limited-voltage electropurge means is able to minimize the impairment of the most delicate and vulnerable microcircuits while effectively removing and/or virtually eliminating harmful colloidal or sub 0.04-micron contaminant particles.

BACKGROUND OF THE INVENTION

The RCA Standard Clean developed by Werner Kern and other RCA scientists in the late 60's is extremely effective in removing contamination from silicon surfaces of semiconductor wafers and is today and has been the defacto industry standard for more than 30 years.

The rapid progress in the semiconductor industry, due in large part to the effectiveness of RCA clean (i.e., SC1/SC2), is described in detail in Werner Kern's 1993 book "Handbook of Semiconductor Wafer Cleaning" (680 pages).

The industry still relies on this hydrogen peroxide-based wet-chemical process where wafers are immersed in several chemicals sequentially to remove particles, metallics, organics, and native oxides.

During the last two decades, the standard wafer cleaning processes used in the fabrication plants included both megasonic transducer means and RCA-type cleaning solutions. The preferred megasonic cleaning system after the year 1990 employed direct-coupled transducer means (See 1989 U.S. Pat. No. 4,804,007, Verteq, Inc.). Such means was capable of providing at least 3 watts of RF power per square centimeter of the transmitting surface.

Later, an improved transducer means developed by PCT Systems, Inc., was able to provide much more power by avoiding or reducing unwanted interference between different sonic waves as described, for example, in U.S. Pat. No. 6,098,643. Such high-power transducer means, when operated at high energy levels above 5 watts per square centimeter, were more effective in removing particulates and greatly reduced the time required for satisfactory wafer cleaning. However, such megasonic transducer means was inefficient and ineffective in removing particles with a size smaller than 0.12 micron.

The sub 0.1-micron killer particles left on the wafer surface after cleaning presented a major, major problem. During the last decade, in the fabrication of advanced devices having a line width or feature size of 0.25 micron, the killer particles in the size range of from 0.05 to 0.07 micron, for example, that could not be eliminated by megasonic means, were particularly troublesome. There were a number of possible ways to reduce the number of such killer particles as by repeated treatment of the wafer surface with aqueous ammoniacal or SC-1 solutions, repeated or multiple DI water rinses, longer chemical treatment sequences, repeated treatment with corrosive diluted HF acid solutions, or other more sophisticated techniques.

The use of sophisticated chemical treatments or other special measures combined with the best available megasonic means was highly advantageous but not an ideal or complete solution to the particulate contamination problem. It made possible the commercial manufacture of advanced devices with a line width or feature size of 0.18 micron. The semiconductor industry was, of course, aware of the major shortcomings of megasonic wet wafer cleaning systems and their inability to eliminate sub 0.1-micron particles. It was manifest to everyone that the known megasonic wafer cleaning systems were deficient and inadequate for manufacture of the more advanced microelectronic devices, such as those having a line width or feature size of 0.10 micron or less and also that extensive research would be needed to solve the seemingly impossible particle contamination problem.

In recent years, researchers came to realize that the use of excessive megasonic energy during the fabrication process was risky and could degrade the microcircuits and cause them to be unreliable, and that serious defects would often be undetectable. In the case of more advanced MOS devices having ultrathin gate oxide layers with a thickness of from 10 to 20 angstroms, the impact of high-energy megasonic pressure waves would be intolerable. It therefore, would be preferable to operate at a safe or limited power level, no greater than about 3 watts per square centimeter, to minimize the risks in spite of the fact that the lowered power substantially reduced the effectiveness of the pressure waves and made it impossible to eliminate the harmful sub 0.1-micron contaminant particles.

The particulate contamination problem is a crucial one that must be solved soon in order to permit manufacture of advanced new generation devices with line widths or feature sizes, such as 0.05 to 0.10 micron, or gate oxide thicknesses of 10 to 20 angstroms. For that reason there has been an intense and frantic research effort for the last 5 years to solve the problem. It has so far been unsuccessful. The foremost experts in the field concluded that megasonic systems or other wet wafer cleaning systems were not promising, that they provided no practical way to remove or eliminate sub 0.1-micron killer particles, and that the semi-conductor industry would have to develop more sophisticated dry wafer cleaning processes.

Heretofore the semiconductor industry believed that wet cleaning methods would never be effective in removing adhered colloidal-size contaminant particles. For the last 30 years the most competent scientists have been convinced that the primary force binding a colloidal-size particle to a wafer surface is van der Waals attraction which is universal and dominating when separation distances between a particle and a surface are extremely small. The forces of attraction increase as the particle size decreases so that it appears virtually impossible to overcome the van der Waals forces when the particle size is 0.01 micron or less.

On this basis the best scientific minds grappling with the problem including foremost experts, such as Werner Kern, concluded that wet cleaning processes could not provide a satisfactory way to remove colloidal-size particles when manufacturing the most advanced microchips and that the only real hope for success was a breakthrough or major improvement in dry wafer cleaning technology.

SUMMARY OF THE INVENTION

The present invention relates to unique processes and apparatus for wet processing of semiconductor wafers in which the wafers are electrically charged and more particularly to a special wafer cleaning system that is effective in removing colloidal- or sub 0.1-micron size particles that cannot be removed effectively by any known prior-art process.

The invention involves the discovery that colloidal-size particles bonded to a wafer surface containing delicate microcircuits can easily be removed and repelled when the wafer is negatively charged in a suitable manner by applying a relatively small or limited voltage insufficient to damage or degrade vulnerable portions of the microcircuits or significantly reduce the yield of top-quality microchips.

The process and apparatus of the present invention are designed for use in the fabrication of microelectronic devices on semiconductor wafers where delicate microcircuits are formed on the front face of the wafer by 250 to 350 steps or more including many layering, patterning and doping operations and a large number of wet processing steps. The preferred process of this invention is characterized in that the front face of each process wafer is provided with a suitable negative electric charge, such as 5 volt to 40 volts or more, during wet processing and an effective field intensity sufficient to dislodge and remove colloidal-size or sub 0.1-micron particles. The invention also contemplates reversing the charge on the wafer.

Major advantages of the present invention can be obtained when using the preferred embodiment wherein a single wafer is subjected to wet processing in a flattened receptacle as in FIGS. 1 to 7 hereof. For example, a quartz glass receptacle, A, can be provided with a narrow internal cavity (e.g. of a size to receive one 200 mm, 300 mm or 400 mm wafer) having flat parallel glass wall spaced a short distance from the flat wafer faces. An aqueous solution or DI water would be caused to flow from the bottom to the top of the receptacle while the surface of the wafer was electrically charged. A desired negative charge is preferably induced by employing a positively charged metal plate, layer or coating at the flat outer surfaces of the receptacle.

A single-wafer receptacle has a unique and important advantage in that the front and back faces of the wafer can be provided with the same negative charge, thereby cleaning both faces simultaneously.

The wafer cleaning process of this invention is particularly advantageous and of crucial importance in the fabrication of the most advanced microelectronic devices having a line width or feature size of from 0.05 to 0.10 micron or having ultrathin gate oxide layers (e.g., with a thickness of from 10 to 20 angstroms). Optimum or superior results can often be obtained in an electromegasonic cleaning system using direct-coupled piezoelectric transducers preferably operating within a low-risk power range (e.g., up to about 2 watts per square centimeter).

This invention provides a remarkably-effective synergistic combination of limited-power megasonic transducer means and limited-voltage electropurge means that avoids or minimizes impairment of the delicate and vulnerable microcircuits while virtually eliminating harmful sub 0.04-micron contaminant particles. The unique process is a godsend that permits satisfying yields of reliable top-quality advanced MOS devices with extremely thin gate oxide layers (e.g., with a thickness perhaps as low as 10 angstroms).

An object of the present invention is to meet semi-conductor industry goals in a simple and effective manner by substantially eliminating "killer particles" and minimizing the number of troublesome particles (e.g., those with a particle size more than 10 percent of the minimum line width or feature size) which are highly undesirable.

Another object of the invention is to provide a unique wet cleaning process that is highly effective in removing extremely small or colloidal-size particulates while avoiding electrolysis or current flow and eliminating the risk of ionic contamination.

Another object is to provide a unique wet megasonic wafer cleaning process that does not injure, alter or seriously impair the delicate highly-vulnerable microcircuits of the more advanced semiconductor devices having line widths or feature sizes below 0.10 micron and that is effective in removing sub 0.1-micron contaminant particles.

A further object is to provide a synergistic combination of limited-power megasonic transducers and limited-voltage electropurge apparatus that is safe, reliable and effective in cleaning of microelectronic devices.

Another object of the invention is to promote rapid and continual upgrading and perfection of the electropurge processing system by evolutionary and trial-and-error techniques using the most advanced computerized monitoring techniques available (See Ser. No. 09/378,556).

Progress in Computer Technology

In recent years there has been remarkable progress in the field of artificial intelligence. Areas being exploited and explored include genetic algorithms (GA) and neural networks that mimic the brain.

Computer scientists use the terms "genetic algorithms" (GA) to describe modern computer routines based on biogenetics and Darwin's theory of evolution. Computer learning by use of GA is the 1992 brain child of pioneer John Holland and is essentially evolutionary engineering by trial and error. In genetic computer programming, GA packages apply the theory of gene mutation and combination, using directed random searches to locate and discover optimal solutions to complex and seemingly unsolvable problems.

Pioneer work with GA carried out by computer scientist Adrian Thompson involves a field programmable gate array (FPGA) that can change its circuits to learn new tasks. This is a major, major breakthrough in the field of computer learning. Current FPGA microchips are good for 10,000 to 100,000 gates, but in 10 years they may be capable of handling 1 to 10 million gates (*Newsweek*, May 11, 1998).

Rapid progress in wafer cleaning technology toward perfection, virtual elimination of killer defects, and optional yields of premium or defect-free microchips will be best promoted by employing the most sophisticated computer brains and complex computer-controlled equipment that facilitates or assures continual upgrading of the manufacturing process.

Machine intelligence and computer learning based on GA and evolutionary techniques has tremendous potential and has progressed rapidly as explained and described in prior application Ser. No. 09/378,556.

Wafer Cleaning Technology

Surface contamination is considered to be a major problem in the semiconductor, aerospace, and pharmaceutical industries. The adhesion of contaminants to silicon substrates is largely responsible for the yield loss in the manufacturing of VLSI and ULSI devices. Many methods for removing particles from silicon surfaces are currently used but the most common techniques are the wet chemical processes based on the hydrogen peroxide/ammonium hydroxide mixtures (SC1 or APM). The addition of megasonic energy during these processes has been proven to enhance particle removal.

Historically, SC-1 solutions were based on highly concentrated mixtures of ultrapure de-ionized water (DIW), ammonium hydroxide ($NH_4OH$), and hydrogen peroxide ($H_2O_2$), in a volume ratio of 5:1:1 (5 DIW:1 $H_2O_2$:1 $NH_4OH$). Typically, wafers are immersed in these cleaning baths at 70-85° C. for 10 minutes. Higher temperatures are not recommended in order to minimize thermal decomposition of hydrogen peroxide and evaporation of ammonium hydroxide. Wafer rinsing in DI water is usually conducted in intermediate and final steps.

During a SC-1 cleaning process, a cooperative and compensating action exists between the two chemical components. $H_2O_2$ oxidizes the silicon and forms a chemical oxide; the formation of this oxide is limited by the diffusion of the oxidizing species. Ammonium hydroxide, conversely, slowly etches this chemically grown oxide. The result of these two processes is that a chemical oxide layer will continually be generated and removed. Particles are thus removed by this etching and undercutting action. Particle removal efficiency can be increased by increasing the etch rate of $SiO_2$. The etch rate, in turn, can be increased by using greater concentrations of $NH_4OH$ or by elevating the process temperature.

The continually increasing integration of advanced IC manufacturing requires tighter process control and specifications. In addition, more stringent environmental requirements are being mandated to reduce chemical and water consumption and waste. The use of megasonic energy has been applied to many wafer surface cleaning procedures as a means to enhance particle removal, reduce chemical concentrations, and shorten process times. The acoustic waves needed for cleaning are about 0.8 to 1.2 MHz and are generated from piezoelectric transducers.

The RCA Standard Clean, developed by W. Kern and D. Puotinen in 1965 and disclosed in 1970 [1] is extremely effective at removing contamination from silicon surfaces and is the defacto industry standard [2]. The RCA clean usually consists of two sequential steps: the Standard Clean 1 (SC-1) followed by the Standard Clean 2 (SC-2). The SC-1 solution, consisting of a mixture of ammonium-hydroxide, hydrogen-peroxide, and water, is a most efficient particle removing agent.

Wafer rinse stages are an integral part of the chemical processes necessary in semiconductor device manufacturing. As continually be generated and removed. Particles are thus removed by this etching and undercutting action. Particle removal efficiency can be increased by increasing the etch rate of $SiO_2$. The etch rate, in turn, can be increased by using greater concentrations of $NH_4OH$ or by elevating the process temperature.

The continually increasing integration of advanced IC manufacturing requires tighter process control and specifications. In addition, more stringent environmental requirements are being mandated to reduce chemical and water consumption and waste. The use of megasonic energy has been applied to many wafer surface cleaning procedures as a means to enhance particle removal, reduce chemical concentrations, and shorten process times. The acoustic waves needed for cleaning are about 0.8 to 1.2 MHz and are generated from piezoelectric transducers.

The RCA Standard Clean, developed by W. Kern and D. Puotinen in 1965 and disclosed in 1970 [1] is extremely effective at removing contamination from silicon surfaces and is the defacto industry standard [2]. The RCA clean usually consists of two sequential steps: the Standard Clean 1 (SC-1) followed by the Standard Clean 2 (SC-2). The SC-1 solution, consisting of a mixture of ammonium-hydroxide, hydrogen-peroxide, and water, is a most efficient particle removing agent.

Wafer rinse stages are an integral part of the chemical processes necessary in semiconductor device manufacturing. As an important stage in an integrated process, rinsing plays a central role in device yield, cost of ownership and environmental issues which continue to have increasing importance for the semiconductor industry. Because of these considerations, there are significant benefits to developing optimized rinsing processes, including better device performance, reduced water consumption, shorter cycle times, higher tool utilization and higher throughputs—all leading to lower cost of ownership.

Environmental and economic considerations are now significant when discussing rinsing processes. For example, in the front end of line (FEOL), through the first contact cut, approximately 20 separate cleaning sequences are needed to provide sufficient surface quality and to isolate each step from the others. A typical sequence may include, 4 cleaning baths, 4 rinses, and a drying step. For 20 FEOL cleans this is 80 rinses.

Hydrofluoric Acid Solutions

Mixtures of concentrated hydrofluoric acid (49 wt % HF) and DI water have been widely used for removal by etching of silicon dioxide ($SiO_2$) films and silicate glasses (e.g., phosphosilicates, borophosphosilicates) that were grown or vapor deposited on semiconductor substrate wafers. The chemical dissolution reactions have been identified and described in the literature.

The thin layer of native oxide on silicon, sometimes 1.0 to 1.5 micron (um) thick, is removed by a brief immersion of the wafers in diluted (commonly 1:50 or 1:100) ultrapure filtered HF solution at room temperature.

Sulfuric-Acid/Hydrogen-Peroxide Mixtures

Removal of heavy organic materials from silicon wafers, such as photoresist patterns and other visible gross contaminants of organic nature, can be accomplished with mixtures of 98% $H_2SO_4$ and 30% $H_2O_2$. Volume ratios of 2-4:1 are used at temperatures of 100° C. and above. A treatment of 10-15 min at 130° C. is most effective, followed by vigorous DI water rinsing to eliminate all of the viscous liquid.

Conventional RCA-Type Hydrogen Peroxide Mixtures

These are the most widely used and best established cleaning solutions for silicon wafers. They are made up of ultra-filtered, high-purity DI water, high-purity "not stabilized" hydrogen peroxide, and either electronic-grade ammonium hydroxide or electronic-grade hydrochloric acid. These mixtures, used in two process steps, have become known as RCA standard cleans (SC-1 and SC-2). The treatment is usually preceded by the preliminary cleaning.

The first step uses a mixture (SC-1) of 5:1:1 by volume of DI water, $H_2O_2$ (30%, "not stabilized"), and $NH_4OH$ (29 w/w % as $NH_3$) at 70° C. for 5 min. followed by quench and rinse with cold ultra-filtered DI water. This deceptively simple procedure removes any remaining organics by oxidative dissolution. Many metal contaminants (group IB, group IIB, Au, Ag, Cu, Ni, Cd, Co, and Cr) are dissolved, complexed, and removed from the surface.

The solution temperature should be 70° C. for sufficient thermal activation, but must not exceed 80° C. to avoid excessively fast decomposition of the $H_2O_2$ and loss of $NH_3$.

The second step in the conventional RCA cleaning procedure uses a mixture (SC-2) consisting of 6:1:1 volume of DI water, $H_2O_2$ (30%, "not stabilized"), and HCl (37 w/w %). A solution temperature of 70° C. for 5-10 minutes is used followed by quenching and rinsing as in the SC-1 treatment. SC-2 removes alkali ions, $NH_4OH$-insoluble hydroxides such as $Al(OH)_3$, $Mg(OH)_2$, and any residual trace metals (such as Cu and Au) that were not completely desorbed by SC-1.

An optional etching step with dilute HF solution can be used between the SC-1 and SC-2 treatments of bare silicon wafers. Since the hydrous oxide film from the SC-1 treatment may entrap trace impurities, its removal before the SC-2 step should be beneficial. A 15-second immersion is 1% $HF—H_2O$ (1:50) solution is sufficient to remove this film.

Each of the chemical cleaning and rinsing operations described above using alkaline or acid solutions and pure water (e.g., using SC-1 or SC-2 solutions or the like in RCA-type sequences) can be enhanced by applying to each semiconductor wafer a predetermined limited voltage, such as 8 to 40 volts or more, in accordance with the invention as described hereinafter. Providing an adequate or ample electric charge on the wafer during wet processing in a receptacle of the type shown in FIGS. 1 to 7, for example makes possible remarkably effective removal of sub 0.05-micron contaminant particles.

Future Needs

Particle removal in the sub 0.05-micron regime is a key requirement for advanced cleaning technologies and is essential when making modern microchips with a line width of 0.15 micron. Unfortunately megasonic cleaning technology is inadequate or ineffective in removing silica particles of such small size.

The simple fact is that current wet cleaning technology does not provide a satisfactory answer to the microcontamination problem and may not permit reduction in line widths to 0.10 micron or below, the industry goal.

Frequent wet cleans are essential during wafer processing to achieve satisfactory yields. In the 362-step manufacturing process previously described, more than 50 wet cleans would be employed. Wet benches are commonly used for wet cleaning operations and may employ robotic means for automatically advancing silicon wafers from one station to the next.

When using RCA standard cleans (SC-1 and SC-2), a typical wet bench includes 5 or 7 recirculation immersion tanks, such as the tank shown in U.S. Pat. No. 5,520,205, in which liquid is continuously pumped into the bottom of the tank and caused to overflow. Liquid cleaning, rinsing and drying steps in a typical wafer processing sequence (MOS gate oxidation) are shown by cross hatching in FIG. 3 (Kern page 281). A 5-tank wet bench could, for example, start with an HF strip and DI rinse followed by SC-1, DI rinse, SC-2 and DI rinse. Megasonic cleaning means would typically be used in the SC-1 bath but could also be used in the SC-2 bath and/or the rinse baths. A 7-tank wet bench could include a final HF bath followed by another DI rinse.

Needless to say, very large amounts of deionized (DI) water are required for the typical cleaning system. The water is extremely pure with a typical resistivity of 18 mega ohms. The DI water is usually dumped after use but can sometimes be cleaned and recirculated.

A 5-tank or 7-tank wet bench of the type described above could, for example, be employed for each of the wet clean steps 2, 5, 23, 35, 37, 63, 68, 70 and 108 of the 362-step manufacturing process previously described. It will be understood that the semiconductor wafers being processed must be dried at the conclusion of each wet clean before the next dry process step. A spin rinse dryer or IPA dryer is commonly used for this purpose.

The specific 362-step fabrication process of the SEMATECH publication, pages B-3 to B-14 includes the lithographic (patterning-doping) sequence of described steps 14-22 and seven other lithographic sequences 25-34, 72-81, 82-92, 110-118, 119-128, 135-143 and 144-153 that are basically the same as the sequence 14-22, except for added inspection steps 31, 87, 124 and 149. Note also that there are slight differences at the ion implantation steps 78, 79, 89 and 90. Two other lithographic sequences 41-51 and 178-187 are quite-similar but omit the implant step (20) and include added etching steps 48, 49 and 185.

The aforesaid fabrication process also includes the previously described layering-patterning sequences 195-204 and 214-224 involving metal or oxide deposits, steps 195 and 214, and chemical-mechanical polishing, step 211. It also includes three sequences 233-242, 269-278 and 335-344 that are basically the same as the described sequence 195-204 and three sequences 247-260, 283-296 and 314-331 that are basically the same as the described sequence 211-224.

The 362-step fabrication process includes more than 50 wet cleaning or wet processing operations that can be modified and improved in accordance with my invention as by inducing a substantial electric charge in each silicon wafer. These include eleven RCA-type wet cleaning operations (such as described steps 2, 5 and 23) including steps 35, 37, 63, 68, 70, 108, 129 and 154; four HF cleans, steps 65, 93, 103 and 133; five post CMP cleans, (such as described step 212) including steps 175, 248, 284 and 320; nine NMP cleans (such as described step 209) including steps 227, 245, 263, 281, 299, 317, 334 and 347; ten resist-strip with NMP (such as described steps 204 and 224) including steps 242, 260, 278, 296, 331, 344, 356 and 362 and fourteen resist-strip with $H_2SO_4$ (such as described steps 13 and 22) including steps 34, 51, 62, 81, 92, 105, 118, 128, 143, 153, 161 and 187.

Proposed Laser-Boil Cleaning System

In recent years a hybrid laser cleaning system has been proposed for use in cleaning semiconductor wafers. In this system a wafer is wetted and covered with a water film. A laser beam directed against the liquid film causes violent localized boiling that helps remove particulate contamination.

Planarization and Post CMP Cleaning

Successful mass production of the advanced microchips used in today's computers became possible because of the development of a number of planarization techniques used to offset the effects of varied wafer topography. The techniques of multilayer resist processing, planarization layers, reflow, and chemical-mechanical polishing (CMP) are collectively known as planarization techniques.

The planarization methods do not guarantee an absolutely flat wafer surface ideally suited for subsequent lithographic operations. The only process that provides a global planarization of an entire wafer face is CMP, the same basic process used to flatten and polish the wafers sliced from the silicon crystal after crystal growing. Unfortunately the abrasive material used for polishing (i.e., silica or aluminum oxide) creates a major particulate contamination problem.

In a typical CMP polishing operation the wafers are mounted upside down on a holder and rotated in the other direction as in the SpeedFam CMP-V system shown and described in "Semiconductor International", May 1993 (FIG. 10.16 of the 1993 article is a picture). An alkaline slurry of silica (glass) or aluminum oxide suspended in a mild etchant, such as potassium or ammonium hydroxide, is caused to flow between the wafer and the polishing pad.

The removal of particulate contaminants from semiconductor wafers during post CMP cleaning operations is a most difficult and perhaps the most important of all wet processing operations in the fabrication of advanced microchips.

At the present time mechanical wafer surface scrubbers are considered the most practical when particulate removal is critical as in post CMP processing. The scrubbers usually hold the wafer on a rotating vacuum chuck. While being firmly held, a rotating brush is brought in near contact with the rotating wafer while a stream of deionized water (often with a detergent) is directed onto the wafer surface. This creates a high-energy cleaning action at the wafer surface. The liquid is forced into a small space between the wafer surface and the brush ends where it achieves a high velocity, which improves the cleaning action.

DESCRIPTION OF THE DRAWINGS

FIG. 1 is a front elevational view on a reduced scale showing a unique wafer cleaning means A in the form of a flattened quartz glass receptacle 10 having a narrow internal cavity that receives a single semiconductor wafer w;

FIG. 2 is a fragmentary elevational view on a larger scale with the flat front wall 2 of the receptacle omitted and a portion of the marginal tube being shown in section;

FIG. 3 is an enlarged fragmentary sectional view of the inclined tube portion 6;

FIG. 4 is an enlarged fragmentary sectional view of the marginal tube 5;

FIG. 5 is a fragmentary top view of tube portion 6;

FIG. 6 is an enlarged fragmentary sectional view taken on the line 6-6 of FIG. 2;

FIG. 7 is an enlarged fragmentary sectional view similar to FIG. 4 but taken on the line 7-7 of FIG. 2;

FIG. 8 is a schematic foreshortened vertical sectional view on an enlarged scale showing a modified form of split glass receptacle (20) which may be opened for insertion or removal of the wafer;

FIG. 9 is a schematic side elevational view of the receptacle (20) on a reduced scale;

FIG. 10 is an enlarged fragmentary vertical sectional view similar to FIG. 8 showing a modified glass receptacle suitable for wet cleaning of flat panel displays and/or field emission displays and including electrical means for charging the panel or wafer;

FIG. 11 is a side view of the receptacle of FIG. 10 similar to FIG. 9;

FIG. 12 is a schematic vertical sectional view showing another modified form of wafer cleaning apparatus;

FIGS. 13 and 14 illustrate another version of the single-wafer cleaning means of the present invention, which version would be an admirable replacement for the simple embodiment shown in FIGS. 1 and 2 and is of a type capable of matching or equivalent performance. The two versions are alike and function in the same manner but differ in minor or insignificant respects;

FIG. 13 is a schematic side view of the single-wafer receptacle on a reduced scale showing the circular metal electrode and the bottom megasonic transducers;

FIG. 14 is a fragmentary full-scale end view of the wafer cleaning assembly including the water pump (e.g., as in FIG. 9);

FIG. 15 is a fragmentary view illustrating the basic CMOS structure;

FIG. 16 is a fragmentary view showing a metal-gate MOS transistor; and

FIG. 17 is a schematic view illustrating the basic operation of a typical MOS transistor as represented in the fragmentary electrical diagram of FIG. 18.

WAFER FABRICATION

Figure 8:
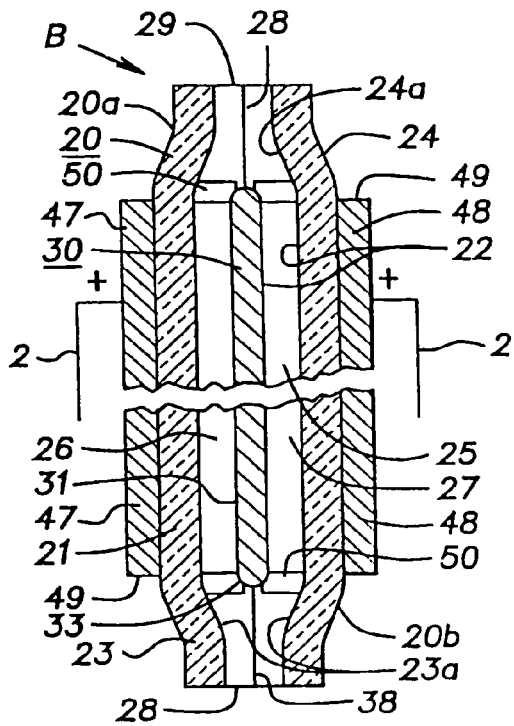
FIGS. 8 to 12 are schematic views illustrating modified forms of apparatus that could be employed in the practice of this invention.

In the field of semi conductor manufacture, the classic textbook is "Microchip Fabrication" by Peter Van Zant (McGraw-Hill, Second Edition, 1990). Chapter 5 presents an overview of the wafer-fabrication process and clearly explains the four basic planar operations on the wafer along with the process sequences used to create the circuit components on the chip surface. Portions of the description are included herein to facilitate an understanding of the subject, particularly at pages 88 to 91 and 95 to 98.

The designs of the devices and circuits are based on a number of different transistor structures. Bipolar and MOS transistors are the major structure designs, and there are numerous variations of them. A multitude of different process flows are possible with hundreds of process options, but only four basic operations are performed on a wafer in the fabrication process. They are (1) layering, (2) patterning, (3) doping and (4) heat treatments. The purpose of the doping operation is to create either N-type or P-type pockets in the wafer surface. These pockets form the necessary N-P junctions for the microcircuits.

The construction of a semi conductor circuit is a multistep process that can involve more than 300 individual steps in the wafer-fabrication stage. The four basic fabrication operations are used in specific sequences to build the parts of the devices in and on the wafer surface.

For purposes of illustration, let's examine the fabrication of one MOS metal-gate transistor in an integrated circuit. The actual construction of the circuit proceeds in steps starting with a polished silicon wafer. An example appears in a table (FIG. 5.17) on page 97 of the aforesaid 1990 van Zant textbook which shows the step-by-step formation of an MOS metal-gate transistor. Eleven process steps are listed in the table including pictured cross sections to illustrate the cross section sequence. The table (FIG. 5.17) is not reproduced here, but the cross section of a completed MOS metal-gate transistor shown on page 88 of the textbook is reproduced herein in FIG. 16.

Step 1: Layering. The building starts with an oxidation of the wafer surface to protect it and serve as a doping barrier. This silicon dioxide layer is called the field oxide.

Step 2: Patterning. The patterning process leaves two holes in the field oxide that define the source and drain areas of the transistor.

Step 3: Doping. Next, the wafer goes to a doping process where an N-type dopant is put through the openings to create two N-type pockets in the wafer surface.

Step 4: Patterning. In step 4, another patterning operation is used to remove the field oxide in the gate region between the source and drain.

Step 5: Layering. The exposed silicon in the gate region is reoxidized with a thin layer known as the gate oxide. At the same time, an oxide grows in the source and drain holes.

Step 6: Patterning. In this patterning step, two holes are patterned in the reoxidized source and drain regions. These holes are called contact holes and will allow direct contact of the metallization layer with the source and drain regions.

Step 7: Layering. Next in the sequence is the deposition of a conductive metal layer. This layer blankets the entire surface of the wafer.

Step 8: Patterning. After deposition, the wafer goes back to the patterning area where portions of the metallization layer are removed from the chip area and the scribe lines. The remaining portions connect all the parts of the surface components to each other in the exact pattern required by the circuit design.

Step 9: Heat Treatment (Alloy). Following the metal patterning step, the wafer goes through a heating process in a nitrogen gas atmosphere. The purpose of the step is to "alloy" the metal to the exposed source and drain regions and the gate region to ensure good electrical contact.

Step 10: Layering. The final layer of this device is a protective layer known variously as a scratch or passivation layer. Its purpose is to protect the components on the chip surface during the testing and packaging processes.

Step 11: Patterning. The last step in the sequence is a patterning process that removes the scratch protection layer over the metallization terminal pads on the periphery of the chip. This step is known as the pad mask.

The 11-step process described above shows how the four basic fabrication operations are used to build an MOS metal-gate transistor structure. The process illustrated includes sequences that show up in all process flows. The doping sequence (steps 1, 2 and 3 is used to create doped regions in the wafer surface. The metallization sequence (steps 6, 7, 8 and 9) is used to provide the metal interconnections of the circuit. The optional passivation sequence (steps 10 and 11) is used in most process flows to provide the top layer protection for the chip.

The leading industry group, SEMATECH, has described in detail the process employed by microchip fabrication plants for producing semiconductor devices with a line width or circuit image size of 0.25 micron (um). The process calls for around 360 process steps including more than 50 wet cleans. The detailed specifications (Steps 1 to 362) are set forth on pages B-3 to B-14 of the special printed SEMATECH publication, Technology Transfer No. 95042802-ENG. A large number of cleaning steps involve SC1, SC2 or other RCA clean features, most or all of which could be modified in accordance with my invention to permit effective removal of extremely small or colloidal-size silica particles with a diameter of 0.05 micron or less which cannot be removed with current technology.

The 360-step wafer fabrication process described above involves only four basic operations. They are (1) layering, (2) patterning, (3) doping, and (4) heat treatments. A detailed overview of the wafer-fabrication process is set forth in Chapter 5 of the 1990 Van Zant book which is incorporated herein by reference. Pages 95 to 99 describe 11 basic steps employed in the formation of an MOS metal-gate transistor structure.

Cleaning steps 175, 212, 248, 284, and 320 of the aforesaid 362-step fabrication scheme shown on pages B-3 to B-14, described as Clean Post CMP, are critically important and pose the difficult problem of removing colloidal-size particles.

The national SEMATECH road map has set forth model defect density (and, by inference, yield) requirements by technology generation. Table 1 is a portion of such road map related to defect density goals.

TABLE 1

| | Defect Goal Trends | | | |
|---|---|---|---|---|
| DRAM equiv. | 16 Mb | 64 Mb | 256 Mb | 1 Gb |
| Min. dimension | 0.50 μm | 0.35 μm | 0.25 μm | 0.18 μm |
| Defects/cm² (% Yield) | 0.1 (87%) | 0.05 (90%) | 0.03 (90%) | 0.01 (95%) |

| | # of defects | defect size | # of defects | defect size | # of defects | defect size | # of defects | defect size |
|---|---|---|---|---|---|---|---|---|
| Killer defects per 200 mm wafer* | 28 | 0.10 μm | 14 | 0.07 μm | 9 | 0.05 μm | 3 | 0.03 μm |

Pages 441 and 442 of the van Zant textbook describe a complementary MOS (CMOS) circuit that is formed with both N-channel and P-channel transistors. CMOS is a favored circuit that has become the standard for many applications.

A typical CMOS structure shown on page 442 (FIG. 16.35) is reproduced herein and illustrated in FIG. 15. CMOS structures are formed by first fabricating an N-channel MOS transistor in a deep P-type well formed in the wafer surface. After the N-channel transistor is formed, a P-channel transistor is fabricated. CMOS processing uses the most advanced techniques with smaller, densely packed, and high-quality components. A cross section sequence is pictured at the top of page 442 (FIG. 16.34) to illustrate basic steps in the formation of a transistor for use in a CMOS circuit.

Bipolar structures using circuitry based on bipolar transistors are pictured on page 439 (FIG. 16.31) of the Van Zant textbook. In general, the high switching speed of bipolar circuits is a compelling reason to employ them in logic circuits. MOS circuits, with their smaller component dimensions and lower power requirements are perhaps best suited for memory circuits. However, bipolar memory circuits and MOS logic circuits are available.

Advanced MOS transistors require gate oxides that are extremely thin (e.g., a thickness of from 10 angstroms to 30 angstroms) and cannot tolerate ionic or particulate contamination. For this reason, the semiconductor industry requires the use of process chemicals of the highest purity and reduction of metallic ions to extremely low levels below 5 parts per billion (ppb) and preferably below 2 ppb. Extremely small contaminant particles in the size range of 0.02 to 0.03 microns become "killer particles" in the advanced MOS transistors.

In MOS technology, thin layers of silicon dioxide are grown in the gate regions of the transistors. This oxide layer functions as a dielectric whose thickness is chosen to allow induction of a charge in the gate region. The gate is a critical part that controls operation of the device and is readily damaged by small amounts of ionic or particulate contaminants. The dominance of MOS technology for large-scale integrated circuits has made the formation of gate regions a prime focus of concern. The need for major improvements in wafer cleaning technology has become critically important.

Extremely small amounts of contaminating particles and metallic ions can result in drastic changes in device performance and reliability of semiconductor devices, particularly modern MOS devices.

Mobile ionic contaminants (MICs) are atoms of metal that exist in the material in an ionic form. These metallic ions are highly mobile in semiconductor materials and can move inside the device to cause failure. The MIC problem is most serious in modern MOS devices, especially those with gate oxides having a thickness less than 30 angstroms.

Ionic and particulate contaminants affect device processing yield, device performance and device reliability. Reliability is the most insidious of the contamination failures. Small amounts of mobile metallic contaminants can get into the wafer during processing and not be detected by the normal testing. When the tested and approved devices are used in the field, these ionic contaminants travel inside the device and eventually end up in electrically sensitive areas, causing failure. This type of failure mode is a primary concern, particularly in the space and defense industries. For this reason, metallic mobile ionic contaminants (MICS) are a primary concern. Today suppliers are producing chemicals with MIC levels less than one ppb.

In the eleven-step process previously described for making MOS transistors, a small percentage of defective devices can be produced in each of the eleven process steps. Yield percentages are normally calculated at every process station. However, there are only three major yield measurement points that are calculated and monitored to measure and control the fabrication process. The first is called wafer-fabrication yield or cum yield and is calculated at the completion of the last fabrication process step by multiplying together the percentage yields at each of the process steps for a particular circuit type. This chain multiplication ends in an accumulated yield (e.g., for the 11-step process described above).

The accumulative wafer-fabrication yield is limited by four dominant factors—, namely the number of process steps, wafer breakage and warping, process variation during doping, layering or patterning processes, and process defects or spot defects, such as isolated regions of contamination or surface irregularities.

The second major yield point is called wafer-sort yield which may, for example, be in the range of from 50 to 70 percent or less depending on the integration level of the particular circuit and other factors. Wafer-sort tests are performed after completion of the wafer-fabrication process. During the test, each chip will be tested electrically for device specifications and functionality. More than 100 individual tests are sometimes performed on each circuit.

Many factors influence the wafer-sort yield including wafer diameter, die size, number of processing steps, circuit density, surface roughness, defect density, crystal defect density, and process cycle time.

The third major yield point is called final test yield and is determined at the conclusion of the assembly or packaging process. In the final test, the packaged die go through a series of physical, environmental and electrical tests. The final yield may be greater than 95 percent.

The success of the entire fabrication process is measured by the overall process yield, which is the mathematical product of the three major yield points described above (i.e., fab yield, sort yield and final test yield). If, for example, during the fabrication of an LSI-level semiconductor device, the fab yield is 80 percent, the sort yield is 50 percent, and the final yield is 95 percent, then the overall yield would be 38 percent. (Modern reliability standards require a much higher yield greater than 60 percent).

The wafer-sort yield is the lowest of the three yield points, sometimes less than 50 percent. Improvement in wafer-sort yield can be extremely important because it has the greatest impact on overall line performance.

Silicon wafers used for making microchips are cut from large ingots of single-crystal structure usually grown by the Czochralski (CZ) method. A high degree of crystal perfection is necessary, but a large number of dislocations and other imperfections are unavoidable. Such imperfections, called crystal defects, can result in serious device process problems by causing uneven silicon dioxide film growth, poor epitaxial film deposition, and uneven doping layers in the wafer. In finished devices, these defects can cause unwanted current leakages and may prevent the devices from operating at the required voltages.

A dislocation is a misplacement of the unit cells in a single crystal that can occur because of growth conditions and lattice strain in the crystal. Crystal dislocations can also occur in wafers because of physical abuse during the fabrication process. For example, a chip or abrasion of the wafer edge (e.g., due to poor handling techniques and automatic equipment) serves as a lattice strain site that can generate a line of dislocations that progresses into the wafer interior during subsequent high-temperature heat treatments, such as oxidations and diffusions. Characteristic wafers contain hundreds of crystal dislocations per square centimeter.

The dislocation lines extend inwardly only part way toward the center of the wafer, the defective die being concentrated in the radially outer portions of the wafer. By increasing the diameter of the wafers from 200 mm to 300 mm, wafer-sort yields can be improved substantially because a larger number of unaffected die are located in the central portion of the wafer.

The smaller diameter wafers have other major disadvantages. Process variation is one of the dominant factors in limiting yield. Process variations occur at a higher rate in the radially outer portions of the wafer. For example, in high-temperature processes, such as those performed in tube furnaces, temperature nonuniformity is a problem. In a lithographic patterning process, for example, the circuit image size will not be uniform because the exposing light is uneven. The nonuniform nature of the light systems used in that process is such that the central portion of the wafer will have more uniformity than the radially outer portions. These problems and the crystal dislocation problems previously described result in lower wafer-sort yield in the radially outer portions of the wafer. Of course, these problems are alleviated by increasing the wafer diameter to 300 mm or more so that a larger area of unaffected die is provided in the central portion of the wafer.

The large 300 mm wafers are obtained from silicon ingots of single-crystal structure grown by the CZ method and having a length of several feet. A specific crystal orientation is required. The two common orientations are the [100] and [111] planes. The (100) oriented wafers are used for fabricating MOS devices and circuits.

The wafers are sliced from the crystal (ingot) with thin circular saws having a cutting edge coated with diamonds. The surface of the cut wafer has to be free of irregularities or saw damage and absolutely flat. Flatting and polishing is carried out in two steps. A rough polish is followed by chemical-mechanical polishing, a combination of chemical etching and mechanical buffing. The net effect is a smooth incredibly-flat surface with a micro-roughness value that is very low, normally less than 3 angstroms rms. The main roughness contribution comes from microscopic polishing scratches on the wafer surface.

Flatness is an absolute requirement when fabricating advanced microchips having feature sizes or line widths from 0.07 to 0.13 microns, particularly advanced MOS devices and circuits having ultrathin gate oxide layers. Interfacial microroughness is a particularly serious problem when the gate oxide layers of the MOS devices have a thickness less than 30 angstroms.

In the fabrication of microchips having advanced MOS circuits with a gate oxide thickness of 15 to 20 angstroms, for example, the silicon wafers should have a smooth atomically planar surface with a roughness value maintained below 5 angstroms rms during the various process steps. The problems due to rough, uneven or malformed surfaces become quite severe in back end (BEOL) process steps where CMP polishing operations and wet cleaning operations become critical and it becomes more difficult to obtain tolerable roughness values below 5 angstroms rms.

Surface roughness creates major problems in the gate region of an MOS device, such as gate integrity problems and problems due to thinning or lack of uniformity in the oxide layer, and also major problems in the lithographic patterning operations. Because of the roughness problem during fabrication operations, the yield of satisfactory or salable microchips is severely reduced. Efforts to minimize the interfacial microroughness may soon result in better yields and should improve device performance and reliability. The use of ultradilute RCA-type cleaning solutions may help to obtain tolerable roughness values, such as 2 to 3 angstroms rms.

As leaders in the semiconductor industry push feature sizes from 0.15 micron toward 0.10 micron or less, serious problems are multiplied due to the inherent limitations of the wafer fabrication operations, such as layering, patterning and cleaning operations, the increases in wafer complexity, the growing number of interconnect layers and lithography steps, the monitoring and inspection problems and inability to detect many defects that seriously affect the performance and reliability of the devices and circuits. Problems of major concern include gate-oxide shorts, metal layer shorts, subsurface electrical defects in interconnect layers, electrical "punctures" or weak points due to asperities or marred surface topography, and lithography problems (e.g., hot spots, scratches, large particles, extra or missing resist, overetch, incomplete etch, unexposed fields, striations, developer spots, etc.).

Traditionally, optical techniques were relied on for defect detection in semiconductor manufacturing. Now an increasing proportion of defects are likely to go undetected. Optical techniques are ineffective in detecting subsurface problems and other potential problems, such as shorts from stringers, particles likely to cause a short between two conductors, under- or overetched contacts, or cracks in a conductor.

DEFINITIONS AND TECHNOLOGY

The definitions, explanations and related sketches or characterizations briefly presented herein are intended to inform and to simplify or clarify the description and claims of this specification.

The language and terminology used herein should be construed in a reasonable and logical manner consistent with the context and normal usage in the semiconductor art. (See Werner Kern's 1993 handbook). Generally the technical terms and jargon can be construed to be consistent with the language or terminology employed in the textbook "Microchip Fabrication" (2nd Edition, 1990) by Peter Van Zant and in the 3rd Edition, 1997.

For example, the terms angstrom, boat, capacitor, CMP, CMOS, CVD, CUM yield, DI water, die, dopant, DRAM, feature size, integrated circuit, channel, bipolar transistor, FET, layering, lithography, LSI, patterning, passivation, photoresist, quartz, RTP, rinse, ULSI, VLSI, wafer, and yield are defined briefly in the Glossary (pages 501 to 516) of said textbook.

The term "feature size" or "line width" is used herein in the usual sense to indicate the minimum width of pattern openings or spaces in a microelectronic device or microchip.

The term "killer defect" is used herein in the broad sense to cover an unacceptable or intolerable defect in the microelectronic circuits of a semiconductor device or microchip caused by a contaminant particle trapped or embedded in the device during the fabrication process. A defect can be considered intolerable or unacceptable if it degrades the electronic circuits substantially or to such a degree that the electronic device has limited utility, is unreliable, or is unacceptable to most customers.

The term "killer defect" is used in a narrow sense in Table 1 on page 5 of this specification to describe trapped or embedded particles with a particle size that is at least about 20 percent of the minimum line width or feature size (identified in the table as "Min. dimension"). That table from the SEMATECH road map indicates that one of the goals is to obtain a 90-percent yield of advanced (0.25 um) wafers with no more than 0.03 killer defects per square centimeter.

The term "killer defect", when used herein in the narrower sense, does not include colloidal-size particles with a size of 0.01 micron or less and does not cover very small microscopic particles (e.g., those with a particle size of from about 5 to about 10 percent of the minimum line width) that are highly undesirable and could affect the quality, reliability and useful life of the device.

A field-effect transistor is a unipolar transistor consisting of a source, a gate and a drain whose action depends on majority carriers only. The flow of majority carriers past the gate from the source to the drain is controlled by the transverse electric field under the gate.

The common field-effect transistor is an N-channel MOS transistor (NMOS) having a source and drain of the N type. Most high-performance MOS circuits are built around N-channel transistors due to the higher mobility of electrons in silicon.

In a complementary field-effect transistor (CMOS), N-channel and P-channel MOS transistors are provided on the same microchip generally as shown and described on pages 441 and 442 of the 1990 van Zant textbook (See FIG. 16.35).

A channel is a thin region of an MOS transistor or other semiconductor that supports conduction or electron flow. When the channel length in an NMOS transistor is less than 0.2 micron and the gate oxide thickness is less than 40 angstroms, interface roughness and imperfections due to uneven or malformed surfaces or other marred surface topographies often causes serious reduction in channel mobility and current flow.

Within an MOS transistor, the gate (a capacitor) operates by a field effect and is the part that controls operation of the device. When a small voltage is applied to the gate, there is either a buildup of charge or a depletion of charges (depending on the polarity of the gate voltage) that creates a conducting channel under the gate. The source and drain are essentially shorted together as the connecting channel is formed, and an electric current starts to flow from the source region to the drain region.

A certain amount of voltage must be applied to the gate metal before the channel forms. The amount required to first form the connecting channel is called the threshold voltage of the device.

Every MOS transistor is designed to operate with a threshold voltage having a specific value that is a critical circuit parameter. Factors that affect gate threshold voltage and operation are gate-oxide thickness, channel length and gate doping level (i.e., the dopant concentration in the gate region). Ion implantation, with its ability to dope through thin oxides, is used to set the gate doping level and can also be used to alter the field dopant concentration. Adjustment of the threshold voltage in MOS devices is perhaps the most important use of ion implantation.

During the implantation process, the wafer crystal structure is damaged by the colliding ions in several ways. Lattice damage occurs when the ions collide with host atoms and displace them from their lattice site. The most common implant-produced defect comes about when an incoming ion strikes and knocks a substrate ion from a lattice site.

Postimplant annealing is employed for repair of the crystal damage and for electrical activation of the dopants. RTP techniques are employed to provide extremely fast surface heating that restores the damaged crystal.

In the fabrication of advanced MOS devices and circuits with ultrathin gate oxide layers, the patterned silicon wafer will amass thousands of undesirable imperfections which may include a few hundred yield-relevant defects worthy of serious consideration. A high proportion of the defects or imperfections are considered tolerable and may not have much effect on device performance.

Layering is an operation to add thin layers to the wafer surface by growing or by deposition. Layering steps are employed, for example, in the manufacture of an MOS transistor to grow oxide layers and to deposit metal layers. Oxidation of the silicon is normally carried out in a rapid thermal oxidation (RTO) system.

Patterning is the series of steps that results in the removal of selected portions of the added surface layers. It is the most critical of the four basic wafer fabrication operations and sets the critical dimensions of the devices. The patterning process is called photolithography or photomasking.

Chemical mechanical polishing (CMP) is a planarization method for forming a flat polished surface. A CMP wafer polishing machine is employed during the back end (BEOL) steps of the wafer fabrication process, usually with colloidal silica as the polishing media. In the fabrication of advanced MOS semi-conductor devices with ultrathin gate oxide layers, CMP is needed to maintain surface roughness values within tolerable limits.

The term "ultrathin" is used herein to describe a gate oxide layer with a thickness less than 30 angstroms.

When the gate oxide thickness is less than 30 angstroms, surface roughness can cause many defects that severely affect device performance or reliability. The term electrical weak point describes one of the common defects. That term is used herein in connection with asperities which act like electrical punctures. An asperity can produce such a weak point due to field lines associated with the uneven or malformed topography.

A delicate MOS microcircuit containing such weak point can be highly vulnerable and ruined or severely degraded if subjected to an excessive voltage. For that reason the voltage applied to the wafer surface must be limited when carrying out the electropurge wafer cleaning process of the present invention.

The chemicals and chemical solutions used in RCA-type SC-1 and SC-2 wet cleaning processes must be of high purity and preferably contain less than 3 parts per billion (ppb) of metallic ions, such as calcium, aluminum, iron, copper, zinc, nickel or chromium ions. In the fabrication of advanced microchips, ultrapure chemicals must be used containing preferably less than 2 ppb of contaminating metal ions. Chemical purity comparable to or equivalent to commercially available gigabit-grade bottled chemicals having a metal-ion content of less than 2 ppb can be obtained by on-site (point of use) gas-to-chemical generation (e.g., point-of-use production of ammonium hydroxide for SC-1 wet cleans and hydrochloric acid for SC-2 wet cleans).

The RCA-type SC-1 and SC-2 cleaning baths must be diluted to avoid excessive etching and surface roughening and to reduce costs. The dilute cleaning solutions have a (volume) water-to-chemical ratio of less than 300:1, usually in the range of from 50:1 to 200:1 or somewhat higher. When making advanced microchips with feature sizes, such as 0.10 to 0.15 micron, ultradilute cleaning solutions are used with water-to-chemical ratios of 400:1 to 1000:1 or greater.

Dilution of SC-1 cleaning solutions can be critical in the manufacture of advanced MOS devices with gate-oxide thicknesses less than 30 angstroms because of the stringent requirements on the silicon/gate oxide interface roughness. Etching from RCA SC-1 cleaning operations can have a greater adverse effect on roughness than polishing scratches.

The term "charge density" indicates the degree of charge or current-carrier concentration in a region (e.g., coulombs/$cm^2$).

The term "electrode" is used herein to describe a silicon plate or wafer or a similar metal or metal-coated plate or device that can be electrically charged and employed to induce or create an electrical charge in a process wafer in accordance with the present invention.

A DC power source or power supply can be a direct current generator or battery or other source, such as a transformer-rectifier-filter arrangement.

The term "colloidal" is used herein in the narrow sense of not more than 0.02 micron unless the context suggests a broader sense.

The term "temperate" is used herein with respect to megasonic energy, voltage and/or field intensity to describe energy levels that are limited to avoid unwanted or unacceptable harm to or impairment of vulnerable microcircuits.

The term "megasonic" as used herein covers energy waves generated from piezoelectric transducers in the range of from 750 to 1200 kilohertz and is usually used in the practical narrow sense of from 800 to 1000 kilohertz.

A "direct-coupled" transducer is one that is bonded, affixed or held on a glass plate or the wall of a tank. the term "liquid-coupled" is used to describe other types of transducers having no such attachment.

The term "low power" is normally used herein to describe megasonic power levels not substantially greater than 2 watts per square centimeter of transmitting surface.

The term "advanced devices" as used herein refers to microchip or microelectronic devices having a minimum line width or circuit image size no greater than 0.13 micron unless the context shows otherwise.

The terminology used in the patent claims hereof should be construed in a reasonable manner in the light of the description and common usage. Unless the context suggests otherwise the terms are intended to be broad in scope rather than to have an unnecessary limited meaning.

Unless the context or common sense shows otherwise parts or percentages are by weight rather than by volume.

DESCRIPTION OF PREFERRED EMBODIMENTS

One of the embodiments of the present invention is illustrated in FIGS. 1 to 7 and employs a flattened wafer holder and receptacle 10 designed to receive a single semiconductor wafer w. This embodiment and other embodiments of a similar nature using single-wafer receptacles or the like are believed well suited for modern fabrication systems, particularly those that employ silicon wafers with diameters of 200 mm or more.

FIGS. 1 to 7 illustrate an embodiment of the present invention wherein a wafer carrier formed of glass, silicon or other suitable material has a narrow internal cavity that receives a single silicon semiconductor wafer and has means for charging the wafer to a small voltage during wet processing operations. These figures provide a simple schematic illustration of apparatus particularly well suited for use in the practice of the invention and are intended to facilitate a ready understanding of the invention and the various ways the apparatus can be used in a high-tech microchip fabrication plant, for example in a typical 300-plus step manufacturing process that involves 40 to 50 or more wet processing steps.

While these drawings are to some extent schematic and omit features which may be considered valuable or important, they include the basic elements needed for practice of the invention and are drawn substantially to scale.

As shown, a wafer carrier A is provided in the form of an open-top quartz glass receptacle with top surfaces 1 and a pair of identical parallel flat glass walls 2 and 3 preferably spaced apart a distance of several millimeters, usually at least twice the thickness of the silicon wafer. The front and rear glass walls have flat vertical surfaces at opposite sides that are welded to the flat surfaces of straight vertical side bars 4 of rectangular cross section.

A quartz glass tube assembly 5 of semihexagonal shape is welded to the lower margins of the plates 2 and 3 which have an identical semihexagonal shape. It will be understood, of course, that the assembly 5 and the plates 2 and 3 could be semicircular, if desired, to conform more closely to the shape of the circular semiconductor wafer w. A modern wafer used for manufacture of advanced microchips can have a diameter of 200 to 400 millimeters.

The glass tube assembly 5 has two oppositely inclined straight portions 6 welded to a straight horizontal portion 7. The flat surface 13 of tube portion 6 is welded to the flat inclined bottom surfaces of the plates 2 and 3 at opposite sides of a row of regularly spaced vertical openings 12 that direct liquid vertically in the direction of the arrows b (FIG. 3). The horizontal tube portion 7 has a similar flat upper surface welded to the flat horizontal bottom surfaces of plates 2 and 3 on opposite sides of a row of closely spaced vertical openings 14 as shown in FIG. 4. The tube sections 6 and 7 can have the same cross section throughout the length of tube assembly 5 so as to provide an unobstructed passage for flow of liquid between the two side bars 4 and access to all of the multiplicity of openings 12 and 14.

The liquid pumped into the bottom inlet openings 15 of tube portion 7 as indicated by the arrows a is directed vertically from those openings at a multiplicity of regularly or closely spaced locations as indicated by a multiplicity of vertical arrows in FIG. 2. The water or cleaning liquid can be pressurized by the pump P, as in the embodiment of FIGS. 8 and 9, and caused to flow rapidly from the openings 12 and 14 as water jets or separate vertical streams, but this is not essential. The tube assembly 5 is designed to provide substantially uniform upward flow of liquid across the full wafer width. This assures rapid removal of all chemicals when changing from an acid to an alkaline wash or vice versa or changing to a DI water rinse.

Figure 9:
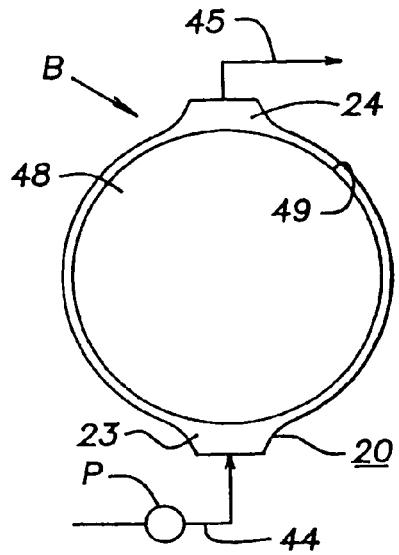

The glass receptacle A of FIGS. 1 and 2 is open at the top edge 1 to permit vertical movement of the wafer w into and out of the narrow internal cavity 16 defined by the flat glass walls 2 and 3 and the marginal members 4, 6 and 7 (The large top opening is unnecessary in the embodiment of FIGS. 8 and 9 because the receptacle is split in half). The top edge portion at 1 provides a weir for overflow of liquid and can be flat or serrated. If the liquid overflows into a tank it can be filtered and recirculated, if desired.

Means are provided for holding and supporting a single semiconductor wafer in a vertical position midway between and parallel to the glass walls 2 and 3. If desired such means can be designed to permit or facilitate rotation of the wafer during the cleaning operation. As shown such means comprises a plurality (e.g., 3 to 5 or more) of wafer guide means 8 and 9 welded to or adhered to the marginal means 4, 6 or 7 and having grooves 11 that received and substantially fit the rounded circumferential edge portion of the wafer w. Such grooves can be shaped to maintain each wafer in the desired vertical position and can permit rotation of the wafer as by water pressure, sonic energy or mechanical means (e.g., see U.S. Pat. Nos. 5,286,657 and 5,698,038). The same applies to the embodiment shown in FIGS. 13 and 14.

In the practice of the present invention electrically-conductive plates, layers or coatings are provided at or near the surface of the glass receptacle to permit charging of the wafers and thereby effect removal of submicron particles adhering to the wafer surface. If a conductive metal coating is employed, it is preferably applied at the outer surface of the plate 2 or 3. However, a layer or coating of silicon metal could be employed at the inner surface. In fact the plates 2 and 3 could be formed of silicon metal to minimize the distance from the charged plate to the wafer surface, thereby increasing the field intensity at a given voltage.

As shown herein a flat conductive metal charge plate or electrode 10 is mounted on the flat outer face of each plate 2 and 3. The plate is circular and has a diameter at least equal to and not substantially less than that of the wafer w, but other shapes and sizes may be appropriate or acceptable (e.g., when the wafer is rotated).

In order to obtain the desired uniformity it is desirable to divide the charge plate 10 or other charging means into a large number of sections so that independent computer control of the electric charge can be provided for each section. As shown the plate 10 is divided into more than 50 square sections to permit such computerized control of the charge density at each section.

In one embodiment of my invention, purging or cleaning of a semiconductor wafer can be carried out using wet cleaning means B of the type shown in FIGS. 8 and 9 comprising a flattened wafer holder and receptacle 20 formed of high-purity quartz glass having parallel flat circular wall portions 21 and 22 of uniform thickness and integral bottom and top portions 23 and 24 suitably connected to bottom inlet and top outlet pipes 44 and 45. A pump P is provided to cause the desired upward flow of DI rinse water or an aqueous cleaning solution through the receptacle 20.

The receptacle 20 can be split to form two halves 20a and 20b that fit together to form an airtight or watertight seal at the vertical split line 38. optionally the receptacle may be divided into upper and lower sections with a seal at a horizontal split line. Suitable means may be provided to clamp or hold the two halves of the receptacle together and to maintain the desired seal. For example, some type of releasable clamping or holding means 39 can be provided to hold the halves 20a and 20b together during the wet cleaning operation and perhaps during a subsequent spin drying operation. Optionally, a series of very small glass projections or spacers 50 or other suitable holding means can be provided to locate or hold the wafer 30 or to hold it in a fixed position.

The unique quartz glass receptacle 20 is shaped to provide a shallow flat circular cavity 25 of uniform width with very shallow portions 26 and 27 of narrow cross section and uniform width at the opposite faces 31 and 32 of the wafer. Optionally the receptacle can be formed in one piece or welded to join opposite halves, but this would require a narrow slot or opening at the top to permit a wafer to be lowered into and raised out of the cavity 25. Robotic means could be provided to lower, raise, and/or hold the wafer during wet cleaning and drying.

The cavity 25 of the receptacle 20 is shaped to assure proper flow of liquid over the flat front and rear surfaces 31 and 32 of the silicon wafer 30, whose circular marginal surface 33 is preferably rounded. The wafer may, of course, have a notch or flat portion at the margin to assure proper positioning during manufacture. The inlet and outlet portions 23 and 24 of the glass receptacle are provided with smooth curved surfaces 23a and 24a, respectively, shaped to assure laminar flow free of eddy currents or turbulence as the aqueous liquid flows into or out of the narrow cavity 25.

The cavity 25 is shown as being generally circular and can have a uniform horizontal width preferably from about 2 to about 5 times the thickness (or horizontal width) of the silicon wafer 30 (e.g., a conventional 200 mm or 300 mm wafer). As shown the cavity width may be 3 or 4 times the wafer thickness so that the narrow spaces 26 and 27 between the wafer surfaces 31 and 32 and the glass surfaces 21a and 22a have a width of only a few millimeters, typically about 2 to 4 millimeters. The thickness of the vertical wall portions 21 and 22 is usually from about 2 to about 5 mm.

Figure 12:
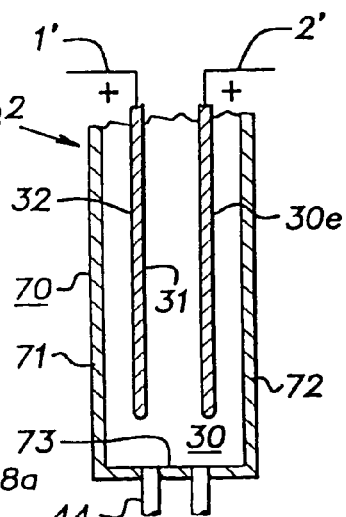

The RCA clean system (SC-1 and SC-2, etc.) or a similar system suitable for modern wafer cleaning is preferred when carrying out the process of my invention using the single-wafer quartz-glass receptacle and also in the embodiment of FIG. 12. The efficiency in removing submicron particles can, of course, be improved by employing megasonic energy. For example, optional megasonic cleaning means can be provided with an array of piezoelectric transducers near the outer marginal portions of the wafer 30 (at 60, FIG. 9). Such means is located to cause the sonic pressure waves to travel through the liquid (from location 60) in a direction parallel to the vertical wafer surface. The impact of these pressure waves on contaminating particles with a diameter greater than 0.1 micron may be sufficient to dislodge them, but may not be effective in removing smaller particles. Megasonic cleaning means are disclosed, for example, in Verteq U.S. Pat. Nos. 4,869,278; 4,998,549 and 5,037,481 and 5,286,657.

Figure 11:
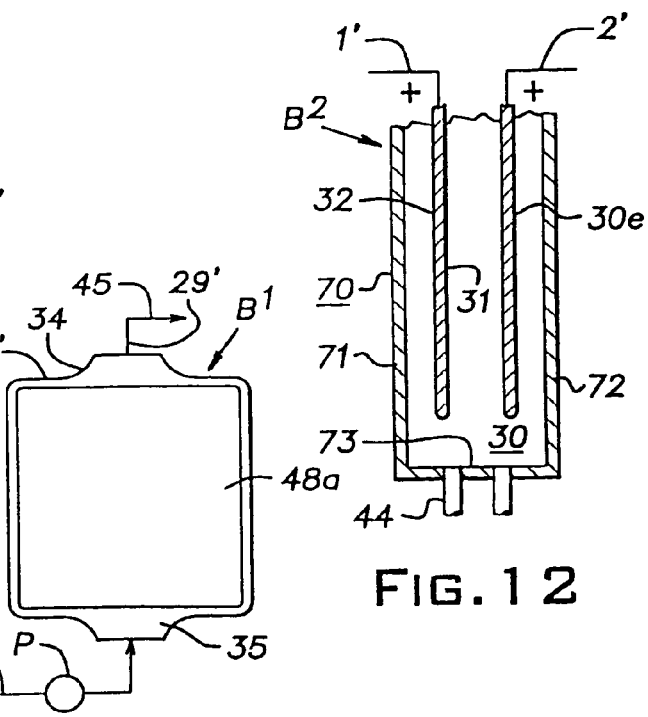

The wafer cleaning apparatus B of FIGS. 8 and 9 is designed to receive flat discs or wafers 30 of circular shape but could be modified as in FIG. 11 for wet cleaning of rectangular discs or wafers with or without the use of megasonic energy (at 60). The wet cleaning process and apparatus of my invention was designed primarily for use during the manufacture of microchips from circular silicon wafers, but is also important for use during the manufacture of rectangular flat panel displays (FPDs) and field emission displays (FEDs). The majority of FPDs are the color-active matrix liquid-crystal displays (AMLCD) most often seen as laptop computer screens.

Both color and noncolor LCD displays are manufactured using microchip-fabrication technology comparable to that described herein. However, the microelectronic devices, transistors, etc. are formed on relatively large rectangular glass plates rather than on a silicon wafer. The typical glass plate of an FPD has a width of at least one foot (300 mm) and is a borosilicate glass. Unlike a silicon wafer, the glass plate (e.g., plate 30') is nonconductive and cannot readily be charged by induction like the silicon wafer 30 of FIG. 1. For this reason it is desirable to employ apparatus of a type specially designed for cleaning the rectangular FPD plate as shown in FIG. 10, for example.

Figure 10:
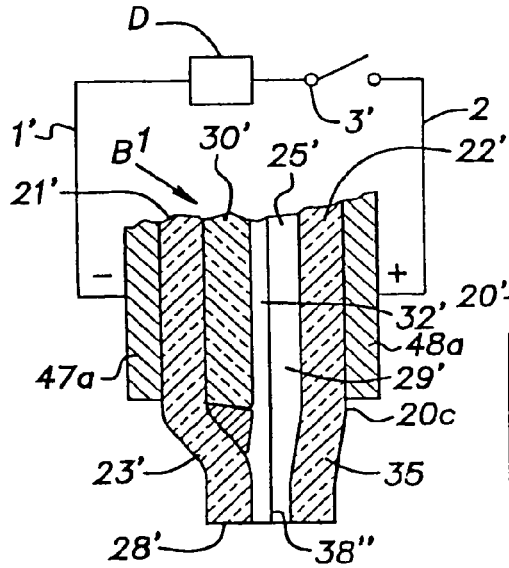

The cleaning means B' of FIGS. 10 and 11 is generally equivalent to the apparatus B of FIGS. 1 and 2 (except for the location of the glass plate 30' against or almost in contact with the flat wall portion 21' of the quartz glass receptacle 20') and is used in the same way (e.g., with the RCA clean sequences).

As shown the cleaning means A comprises a flattened quartz glass receptacle 20' having flat wall portions 21' and 22' of uniform thickness and integral curved bottom and top portions connected to inlet and outlet pipes 44 and 45. The receptacle is formed in two (non-symmetrical) halves that fit together at the vertical split line 38' to form an air-tight or liquid-tight seal throughout the periphery of the narrow cavity 25'. The portion 27' of that cavity between wall portion 22' and plate 30' has a horizontal width that is usually no more than 3 or 4 millimeters and may, for example, be the same as that of the cavity portion 27 of FIG. 8 so as to function in the same way.

The shape of the two-piece glass receptacle 20' differs from that of receptacle 20 at the inlet and outlet ends 28' and 29'. In FIG. 10, the upper and lower portions 34 and 35 of the front half (20c) of the receptacle containing wall portion 22' is preferably symmetrical with only a slight curvature. In the rear half containing wall portion 21', the upper and lower portions are also symmetrical (as in FIG. 8) with a curvature (e.g., at 23') comparable to that of inlet and outlet portions 23 and 24, but the inner surface at the margin of glass plate 30' is shaped to fit the plate at its marginal edge. If desired the receptacle may be made to fit the flat narrow marginal faces of the glass plate (at 33'), thereby eliminating a marginal gap. However, as shown in FIG. 10, there is a marginal gap that's substantially filled with a narrow marginal strip 41 of generally triangular cross section. The strip extends around the entire periphery of the glass plate 30' to promote laminar flow of liquid and minimize unwanted eddy currents or the like. It can be rigid or flexible and can be formed of silicon, glass or other suitable materials.

In carrying out the process of the present invention, a small precision robot can be employed to pick up a single wafer 30 or a single FPD plate 30' and transfer it to a wet cleaning means B or B'. After the wafer or glass plate is placed in and securely located in the open half of the quartz glass receptacle 20 or 20', the receptacle is closed and held closed by clamping means or the like at 39 until the RCA or other cleaning sequence (or rinse) is completed.

The liquid flow provided by a water pump P or in other manner by a spray technique or vapor condensation is toward the outlet end from the inlet. The wafer 30 for example, can be in a substantially vertical position or in an inclined or horizontal position provided the flow is toward the outlet. If desired, one or more receptacles 20 can be spun about a vertical or horizontal axis at any desired speed to provide a centrifugal force on the liquid at the wafer surface. The desired movement of the water or other liquid over the wafer surface may be obtained with or without a pump P. It will also be understood that the DI water in the final rinse may be displaced with isopropyl alcohol prior to spin drying or other final drying operation.

The apparatus B of FIGS. 8 and 9, for example, is inexpensive and well suited for laboratory research. Apparatus of this type designed for research and development work in the field of wafer cleaning happens to be convenient for use in research involving electricity. The glass receptacle 20, for example, can easily be provided with a silver coating or other conducive metal coating (e.g., at 47 and 48) as part of an electrical circuit. The simple circuit shown in FIG. 10, for example, can easily be employed with the wet cleaning apparatus B or B' to apply a positive or negative charge.

That circuit includes a battery means or DC power source D with lines 1' and 2' connected to the negative and positive terminals, respectively, and an on-off switch 3'. The power source D can include means to adjust and measure the voltage or emf.

It has been discovered that inducing a charge in a silicon wafer, such as the wafer 30, by providing a limited voltage, such as 4 to 40 volts, at the metal plate 47 or 48, is effective to remove submicron particles from the wafer surface during microchip fabrication. A voltage insufficient to harm or damage a modern microchip with a line width of 0.15 micron can be sufficient to provide efficient removal of "killer" particles in the sub 0.1 micron range which heretofore could not be removed satisfactorily by any known wet cleaning method.

The embodiment of FIG. 12 includes a thin rectangular quartz glass tank, vessel or receptacle and a plurality of permanently-mounted oxide-coated silicon wafers that serve as positive electrodes on opposite sides of each semiconductor wafer lowered into the vessel. If the vessel is designed to receive 2, 3 or 5 silicon semiconductor wafers (30), then the required number of positive silicon electrodes would, of course, be 3, 4 and 6, respectively. It could be feasible to clean 10 or 20 semiconductor wafers at a time in a tank 5 or 10 times the size of the one shown (which is designed to receive only one such wafer).

In the apparatus of the embodiment of FIG. 12, DI water or other liquid is pumped into the bottom of the vessel and allowed to overflow at a weir or exit to an outlet pipe (not shown). The system could be fully automated. A small precision robot would pick up a single semiconductor wafer from a 25-wafer cassette or wafer carrier and insert this one wafer into the liquid bath midway between and parallel to the two outer positive-electrode silicon wafers.

The outer silicon-wafer electrodes can be connected in a suitable manner to the positive side of a power supply. They would be carefully and gradually charged to a positive emf of say 2 to 30 volts while the semiconductor wafer being processed is charged inductively to a comparable negative emf.

It may be preferable to employ silicon wafers as electrodes when they are immersed in the aqueous bath as shown. All of the silicon surfaces of such electrode wafers will be completely oxidized prior to use so that substantial electrolysis will not occur in the bath. In the case where exposed conductor surfaces exist as IC components, the electrode voltages may be controlled at a low enough level to preclude destructive electrolysis.

In the manufacture of microelectronic devices or the like by the 362-step fabrication process of the aforesaid SEMATECH publication, pages B-3 to B-14, contamination by sub 0.1-micron "killer" particles can be minimized by applying to each process wafer a predetermined limited voltage, such as 4 to 40 volts, during the various wet cleaning or processing operations while the wafer is within the glass receptacle (10) of FIGS. 1 and 2. For example, the desired negative or positive electric charge can be applied to the wafer (w) during each of the necessary wet processing operations including the RCA-type wet cleans, such as steps 2, 5, 23, 129 and 154; HF cleans, such as steps 65, 93 and 133; post CMP cleans, such as steps 175, 212, 248 and 320; and resist strips with $H_2SO_4$ such as steps 13, 22, 62, 105, 143, and 187.

In carrying out the wafer cleaning process of this invention, the patterned front face of the wafer is negatively charged to a small or limited voltage, such as 10 to 40 volts, insufficient to create a substantial risk of harm or damage to any of the delicate microcircuits on that face. The negative charge on the wafer surface at that face is associated with a substantial charge density and an effective field intensity sufficient to achieve or assure effective removal of contaminant colloidal-size and sub 0.03-micron particles that are bonded to or adhere to the wafer surface because of van der Waals forces and other bonding forces. A variety of bonds may be involved including covalent, coulombic, ionic, electrostatic, dipole-dipole and hydrogen bonds.

It may often be desirable to provide a small or limited positive charge at the wafer surface (e.g., by applying 5 to 60 volts) during the acid cleaning step (e.g., when using hydrochloric or hydrofluoric acid as in DHF (dilute HF) HPM or an RCA-2-type wet clean). A megasonic transducer is normally provided to supply sonic energy to assist in the electropurge cleaning or negatively charged wafers. The same megasonic assist can also be employed when the wafer is positively charged as described above. The use of megasonic transducers during RCA SC-1 and SC-2 cleans is preferred but not essential in the practice of the present invention.

The transducers can be made of a suitable piezoelectric material, such as lead zirconate titanate or other commonly used material, and perform well at frequencies of 850 to 900 kHz, for example.

It will be understood that the wet cleaning operations described above using a positive or negative surface charge on the wafer (or reversing the charge periodically) can be carried out using a single-wafer receptacle, such as one of the general type shown in the drawings hereof, made of a suitable material, such as quartz glass or Teflon. The electric charge applied to the wafer surface being cleaned would be such as to provide an effective field intensity (e.g., at least 0.02 volts/mm and preferably at least 0.04 volts/mm).

As the feature size or line width of advanced microchips is reduced below 0.13 micron, the concentration of the wet cleaning solutions is very important. It becomes important to obtain a clean and smooth or atomically flat silica wafer surface (e.g., with surface roughness values preferably under 2 Angstroms). In order to avoid excessive etching and unacceptable surface roughness, dilution of the RCA-type cleaning solutions is required. The dilute or ultra-dilute RCA clean can employ a 300:1 or 1000:1 dilution of 37% HCl in water at 45° C., for example. Metal removal efficiency of this solution is very high with or without the assistance of megasonic energy, particularly when the dilute solution is employed in the electropurge process of this invention (e.g., with a wafer charge of 10 to 60 volts and a field intensity of at least 0.04 volts/mm). This is true with respect to ammoniacal peroxide wafer cleaning baths as well as HF or HCl acid baths. When employing a dilute or ultra-dilute RCA SC-2 clean recipe for wet cleaning (e.g., after an SC-1 clean), hydrogen peroxide is usually desirable but is sometimes omitted.

In the fabrication of advanced microchips with a line width or feature size less than 0.10 micron, it is critically important to control the amount of electrical energy supplied to the megasonic transducers and to limit the power to a safe level, such as from 2 to 3 watts per square centimeter, so that the impact of high-energy megasonic pressure waves is tolerable and unlikely to ruin the microcircuits or render them faulty or unreliable. The yield of satisfactory microchips will be low and unacceptable if the transducers are operated at excessively high power levels because the megasonic pressure waves separate, peel off or seriously damage the essential non-conductive coating layers. The electric circuitry of the microchip is defective and obviously cannot function in the intended manner when it is partially stripped, excoriated or laid bare due to the excessive megasonic energy.

The present application is a continuation-in-part of my copending allowed application Ser. No. 09/490,162, filed Jan. 22, 2000. Claims 1, 2, 5, 7, 8, 10 and 11 of this application correspond to allowed claims 18, 21, 19, 28, 29, 34 and 9 of the copending application.

It will be understood that the above description is by way of illustration rather than limitation and that variations and modifications of the specific processes and devices disclosed herein may be made without departing from the spirit of the invention.

I claim:

1. An electropurge process for economical wet cleaning of semi-conductor wafers during the fabrication of microelectronic devices wherein a single flat wafer is mounted in a fixed position in a narrow shaped receptacle having a flat wall portion parallel to the front face of the wafer and spaced therefrom a short distance, preferably less than 5 mm, and wherein a sequence of several wet cleaning operations is performed on said wafer while it is held in the desired position in said receptacle.

2. A process according to claim 1 wherein at least one face of the semiconductor wafer is charged to a limited but effective voltage, from 4 to 40 volts, during a wet cleaning operation in said receptacle.

3. A process according to claim 1 wherein a flat electrode with a diameter or width comparable to or larger than that of the semiconductor is provided at the outer face of the glass receptacle to induce the electrical charge at the wafer surface during wet cleaning.

4. In a process of the character described for fabrication of advanced microelectronic devices wherein delicate microcircuits with a minimum line width or circuit image size of from 0.5 to 1.0 micron are formed on the patterned front face of a flat circular silicon wafer having a diameter of at least 200 millimeters by a large number of layering, patterned and doping operations in 200 to 350 or more separate steps including 30 to 50 or more wet cleaning steps to remove contaminants from the wafer surface, and wherein each wafer is subjected to megasonic pressure waves while immersed in a dilute cleaning solution, the improvement wherein low-power piezoelectric transducer means provide megasonic energy in an amount no less than 0.5 watts per square centimeter, to avoid substantial impairment of the delicate circuits, and wherein the patterned front face of each silicon wafer is charged by induction to a voltage insufficient to alter or impair the delicate circuits and adequate to cause effective removal of sub 0.04-micron contaminant particles while avoiding electrolysis or current flow and the risk of ionic contamination.

5. A process according to claim 4 wherein the patterned front face of a single flat wafer with a diameter of from about 300 to about 400 mm is subjected to a series of wet cleaning and rinsing steps while the wafer is mounted in the internal cavity of a flattened quartz glass receptacle.

6. An electromegasonic process for fabrication of microelectronic devices on silicon wafers wherein delicate microcircuits with a line width or feature size of from 0.05 to 0.10 micron are formed on the front face of a silicon wafer by many layering, patterning and wet cleaning operations; wherein low-power piezoelectric transducer means direct tolerable and adequate amounts of megasonic energy against the patterned front face during wet cleaning to remove contaminant particles having a particle size above 0.1 micron; wherein said front face is artificially charged during wet cleaning to provide a limited negative voltage of 5 to 40 volts insufficient to alter or substantially impair the delicate microcircuits formed on that face and sufficient to cause effective removal of colloidal-size and sub 0.04-micron killer particles, and wherein the silicon wafer is charged by induction while avoiding electrolysis or current flow and the risk of ionic contamination.

7. A process according to claim 6 wherein said front face is provided with a limited electric charge of at least about 10 volts during most of said wet cleaning operations to minimize particulate contamination.

8. A process according to claim 6 wherein the front face of one thin plate or wafer containing the delicate microelectronic devices is subjected to a series of wet cleaning steps while that plate is mounted in a fixed position in the internal cavity of a flattened quartz glass receptacle.

9. A process according to claim 6 wherein the patterned front face of a semiconductor wafer is subjected to chemical mechanical polishing with colloidal-size refractory particles to obtain an atomically smooth surface with an interface roughness no greater than 2 angstroms rms, and the polished wafer is thereafter subject to electromegasonic cleaning in a tank or receptacle containing an ultradilute cleaning solution and having low-power piezoelectric transducer means supplied with megasonic energy at an effective power level no less than about 0.5 watts per square centimeter, the front face of the wafer being provided with an effective electric charge, no less than about 4 volts, to facilitate successful removal of colloidal-size and sub 0.4-micron killer particles, the voltage and megasonic energy being limited and not enough to alter or substantially impair the delicate microcircuits.

10. A process according to claim 6 for fabrication of advanced MOS transistors wherein the front face of a silicon wafer is provided with an atomically planar surface with a roughness value maintained below 5 angstroms rms during the various process steps, said transistors having delicate microcircuits with an ultrathin gate oxide thickness of from 10 to 20 angstroms; and wherein the amount of metallic mobile ionic contaminants (MICs) is controlled and minimized during wet cleaning operations to improve device processing yield, device performance and device reliability, the MIC levels being maintained below 5 parts per billion.

11. In the fabrication of microelectronic devices on silicon semiconductor wafers where delicate microcircuits are formed on the patterned front face of a flat silicon wafer having a diameter of from about 300 to about 400 mm by more than 200 steps including many layering, patterning and doping operations and at least 30 wet processing steps, the improvement wherein the patterned wafer is subjected to electromegasonic cleaning in a tank or receptacle containing an ultradilute cleaning solution and having low-power piezoelectric transducer means supplied with megasonic energy at an effective power level of from 1 to 2 watts per square centimeter, the front face of the wafer being provided with an electric charge of from 5 to 20 volts to facilitate successful removal of colloidal-size and sub 0.4-micron killer particles, the voltage and megasonic energy being limited and not enough to alter or substantially impair the delicate microcircuits.

\* \* \* \* \*